(12) United States Patent
Schwent et al.

(10) Patent No.: US 8,760,222 B2
(45) Date of Patent: Jun. 24, 2014

(54) METHOD AND APPARATUS FOR CONTROLLING OR MANAGING BANDWIDTH OF A FILTER CIRCUIT WITHIN A SYSTEM HAVING TWO INTEGRATED CIRCUITS

(71) Applicant: Motorola Mobility LLC, Libertyville, IL (US)

(72) Inventors: Dale G. Schwent, Schaumburg, IL (US); Ryan J. Goedken, Lake Zurich, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 13/625,090

(22) Filed: Sep. 24, 2012

(65) Prior Publication Data

US 2014/0084996 A1    Mar. 27, 2014

(51) Int. Cl.
*H03B 1/00* (2006.01)

(52) U.S. Cl.
USPC .......................................... 327/553; 327/555

(58) Field of Classification Search
USPC .......... 327/551, 552, 553, 554, 555, 556, 557
See application file for complete search history.

(56) References Cited

U.S. PATENT DOCUMENTS

| | | | |
|---|---|---|---|
| 6,803,813 B1 * | 10/2004 | Pham | 327/553 |
| 7,272,178 B2 | 9/2007 | Rahman et al. | |
| 7,463,086 B2 * | 12/2008 | Tan et al. | 327/557 |
| 7,692,484 B2 | 4/2010 | Terryn et al. | |
| 2005/0040831 A1 | 2/2005 | Ibrahim et al. | |
| 2005/0168274 A1 | 8/2005 | Kimura | |
| 2008/0169948 A1 | 7/2008 | Okamoto et al. | |
| 2009/0237970 A1 | 9/2009 | Chung | |

FOREIGN PATENT DOCUMENTS

WO        2012109227 A2       8/2012

OTHER PUBLICATIONS

Atso Hekkala et al.: "Adaptive Time Misalighnment Compensation in Envelope Tracking Amplifiers", Spread Spectrum Techniques and Applications, 2008, 9SSSTA '08, IEEE 10th International Symposium on, IEEE, Piscataway, NJ, USA Aug. 25, 2008, all pages.
Patent Cooperation Treaty, International Search Report and Written Opinion of the International Searching Authority for International Application No. PCT/US2013/059869, Jan. 22, 2014, 19 pages.

* cited by examiner

*Primary Examiner* — Lincoln Donovan
*Assistant Examiner* — Jung H Kim

(57) ABSTRACT

A method and apparatus for an adjustable filter system comprises a first integrated circuit generating a reference value that represents a corner frequency of a filter within the first integrated circuit; sending the reference value that represents the corner frequency of the filter across an interface to a second integrated circuit; receiving, across the interface from the second integrated circuit, a filter adjustment value; and changing the corner frequency of the filter using the filter adjustment value to adjust a passband and a stopband of the filter. The apparatus and method also comprises a second integrated circuit detecting a filter adjustment event, wherein the filter adjustment event comprises receipt of the reference value; calculating the filter adjustment value to change a corner frequency of the filter within a first integrated circuit; and sending the filter adjustment value across the interface to the first integrated circuit.

8 Claims, 6 Drawing Sheets

METHOD AND APPARATUS FOR CONTROLLING OR MANAGING BANDWIDTH OF A FILTER CIRCUIT WITHIN A SYSTEM HAVING TWO INTEGRATED CIRCUITS

FIELD OF THE DISCLOSURE

The present disclosure relates generally to bandwidth control or compensation for a filter circuit and more particularly to dynamic bandwidth control or compensation for a change in bandwidth of a filter circuit within a system having two integrated circuits.

BACKGROUND

For cell phones and select mobile devices constrained to operate on batteries, traditional fixed-supply power amplifiers (also referred to herein simply as traditional amplifiers) are being superseded by radio frequency (RF) amplifiers that utilize envelope-tracking (ET) technology for greater energy efficiency. This allows for longer periods of operation on a single charge. A traditional amplifier operates most efficiently in compression. However, since its power supply signal (e.g., supply voltage) is fixed, compression cannot be maintained as an input signal being amplified drops below a peak power value to which the amplifier must be tuned to prevent excessive clipping. As a ratio of the peak amplitude to the average amplitude (i.e., crest factor) grows for the input signal, the traditional amplifier becomes increasingly inefficient.

The implementation of envelope-tracking technology allows an amplifier to remain in compression as signal levels fluctuate. This is accomplished by providing the amplifier with a variable supply voltage that tracks the input signal being amplified. When the input signal drops, the supply voltage drops with it, and efficiency becomes a function of how closely the two signals are synchronized. Generating the power supply signal for the amplifier involves filtering the power supply signal. Filtering, however, affects the time alignment between the two signals due to frequency-dependant phase shifts that are introduced by filter components. It is in this area, i.e., filtering control and time synchronization, that significant improvements to the state of the art are possible.

Accordingly, there is a need for a method and apparatus for controlling the bandwidth of a filter circuit or compensating for changes in the bandwidth of the filter circuit within a system having two integrated circuits.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
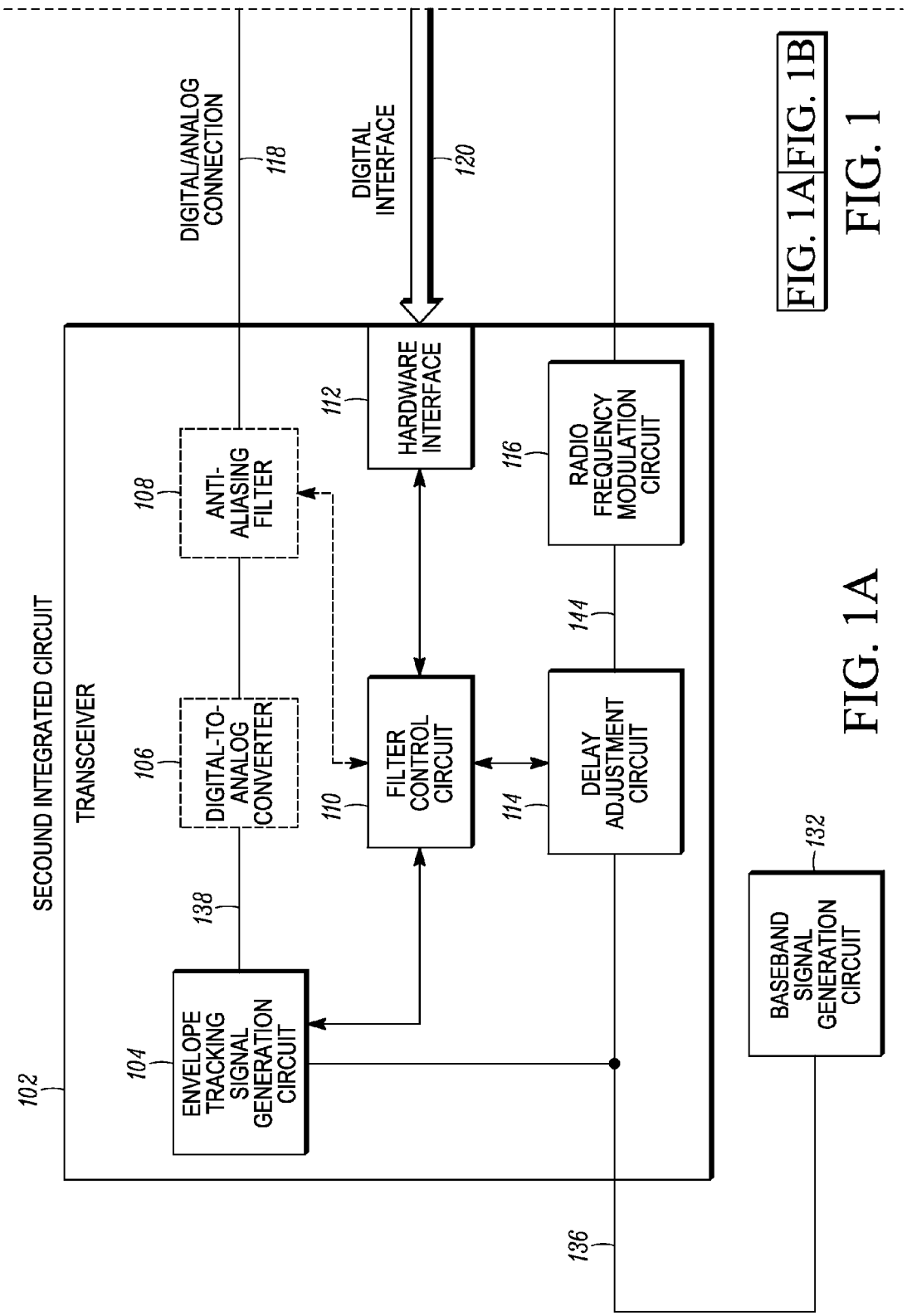
FIG. 1 is a block diagram illustrating an adjustable filter system configured for implementing embodiments of the present teachings.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. In addition, the description and drawings do not necessarily require the order illustrated. It will be further appreciated that certain actions and/or steps may be described or depicted in a particular order of occurrence while those skilled in the art will understand that such specificity with respect to sequence is not actually required.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Generally speaking, pursuant to the various embodiments, the present disclosure provides a method and apparatus for controlling the bandwidth or compensating for bandwidth changes of a filter circuit within a system having two integrated circuits. In accordance with the teachings herein, an adjustable filter system includes: a first integrated circuit comprising a first filter that is characterized by a first passband used to pass at least one desired frequency component of an input signal that is within the first passband; a first stopband used to attenuate at least one undesired frequency component of the input signal that is within the first stopband; and at least one corner frequency between the first passband and the first stopband. The adjustable filter system also includes: a second integrated circuit comprising a filter control circuit configured to generate a first filter adjustment value to move the at least one corner frequency of the first filter; and an interface coupled between the first and second integrated circuits and configured to communicate the first filter adjustment value from the filter control circuit to the first filter. In a particular embodiment, the interface comprises a digital interface.

In one embodiment, the first integrated circuit of the adjustable filter system further comprises a filter reference circuit coupled to the interface and configured to provide a reference value used to generate the first filter adjustment value, wherein the reference value corresponds to a current position of the at least one corner frequency of the first filter, wherein the interface is further configured to communicate the reference value from the filter reference circuit to the filter control circuit.

In another embodiment, the first integrated circuit is an envelope tracking power supply circuit, the second integrated circuit is a transceiver integrated circuit, and the input signal is an envelope tracking signal generated from a baseband signal. Moreover, the second integrated circuit further comprises a delay adjustment circuit coupled to the filter control circuit and configured to calculate a delay of the first filter based on the first filter adjustment value to use in synchronizing timing of arrival, at a power amplifier, of a power supply signal generated from the envelope tracking signal and a radio frequency signal generated from the baseband signal.

Also in accordance with the teachings herein is a method, performed by a first integrated circuit, for adjusting a filter corner frequency. The method comprises: receiving, across an interface from a filter control circuit on a second integrated circuit, a first filter adjustment value; changing a corner frequency of a first filter on the first integrated circuit using the first filter adjustment value to generate a modified passband and stopband for the first filter; and filtering an input signal using the modified passband and stopband. In a particular embodiment, filtering the input signal comprises filtering an envelope tracking signal. In an embodiment, the method further includes: generating a reference value that represents the corner frequency of the first filter before changing the corner frequency; and sending the reference value across the interface to the filter control circuit for use in generating the first filter adjustment value.

Further in accordance with the teachings herein is a method, performed by a second integrated circuit, for compensating for movement of a filter corner frequency. The method comprises detecting a first filter adjustment event comprising receiving a first reference value across an interface from a first integrated circuit, wherein the first reference value indicates a change in corner frequency of a first filter on the first integrated circuit, wherein the change in corner frequency is from a nominal corner frequency. The method additionally comprises calculating, from the first reference value, a first adjustment value to compensate for the change in corner frequency of the first filter, and communicating the first adjustment value.

In one embodiment, communicating the first adjustment value comprises communicating a filter adjustment value to the first filter across the interface to change at least one variable circuit component of the first filter. In another embodiment, the first adjustment value is communicated to an envelope tracking signal generation circuit on the second integrated circuit for modifying a representation of an envelope tracking signal to compensate for the change in corner frequency of the first filter.

In a further embodiment, the method performed by the second integrated circuit for adjusting a filter corner frequency also comprises generating a digital representation of an envelope tracking signal from a baseband signal, wherein the digital representation is used to generate a corresponding analog envelope tracking signal that is filtered by the first filter and used to produce a power supply signal for a power amplifier. The method further comprises: determining a filter processing delay using the first filter adjustment value; and adjusting timing, to the power amplifier, of a radio frequency signal generated from the baseband signal in relation to timing of the power supply signal, wherein the adjusting is based on the filter processing delay.

Figure 1B:
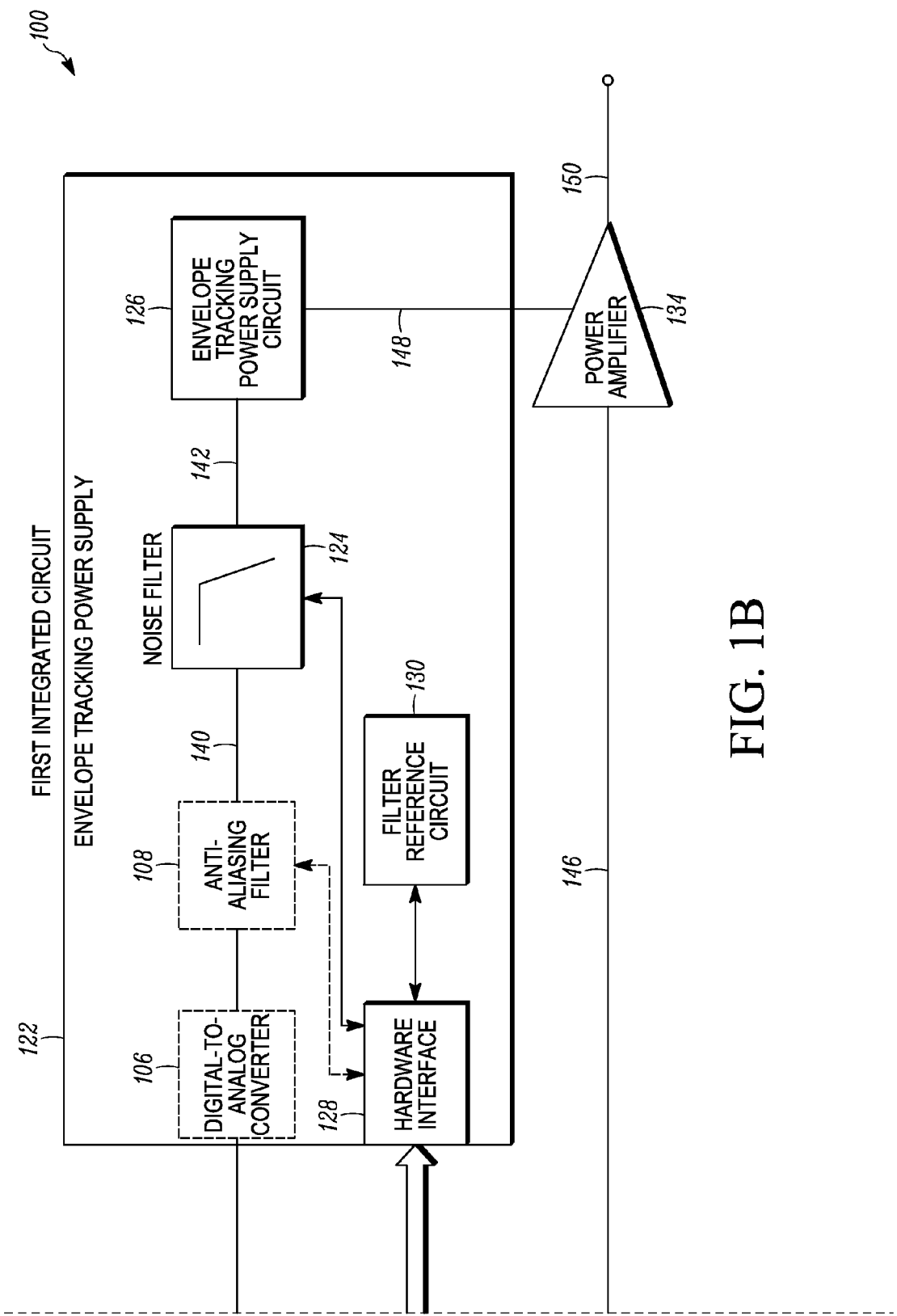

Referring now to the drawings, and in particular FIG. 1, an adjustable bandwidth envelope tracking power supply system (ABETPS) implementing embodiments in accordance with the present teachings is shown and indicated generally at 100. System 100 comprises: an envelope tracking power supply (ETPS) IC 122, a transceiver IC 102, a baseband generation circuit 132, and a power amplifier 134. The ETPS IC 122 includes a noise filter 124, an envelope tracking power supply circuit 126, and a first hardware interface 128, and in some embodiments may include a filter reference circuit 130. In one particular embodiment, the ETPS IC 122 also includes a digital-to-analog converter (DAC) 106 and may also include an anti-aliasing filter 108. In an alternative embodiment, components 106 and 108 may be located on the transceiver IC 102.

The transceiver IC 102, in turn, includes an envelope tracking signal generation circuit 104, a filter control circuit 110, a delay adjustment circuit 114, a radio frequency modulation circuit 116, and a second hardware interface 112. Disposed between the ETPS IC 122 and transceiver IC 102 is a digital or analog connection 118 (wherein the type of connection, i.e., digital or analog, depends on which IC the DAC is located) and a digital interface 120, which is coupled between the first 128 and second 112 hardware interfaces. Only a limited number of system elements 102-134 are shown for ease of illustration, but additional such elements may be included in the system 100. Moreover, other components that may be needed for a commercial embodiment of the system 100 are omitted from the drawing for clarity in describing the enclosed embodiments.

The ETPS IC 122 and the transceiver IC 102 of the ABETPS 100 (also collectively referred to herein as an adjustable filter system) are interchangeably identified herein as a first IC 122 and a second IC 102, respectively. Similarly, the noise filter 124 and the anti-aliasing filter 108 are interchangeably identified herein as a first filter 124 and a second filter 108, respectively. The labels of "first" and "second" are used consistently throughout the present disclosure with regard to the ETPS IC 122 and the transceiver IC 102, and also the noise filter 124 and the anti-aliasing filter 108, to avoid confusion as to which element is being referred to and not to indicate any particular relationship among the elements.

Focusing now on how the individual elements identified within the system 100 are interconnected, the baseband signal generation circuit, shown at 132, is coupled to the envelope tracking signal generation circuit 104 and also the delay adjustment circuit 114. As shown, the baseband signal generation circuit 132 is external to the ABETPS 100, but it is not precluded from being located on the transceiver IC 102 in alternate embodiments. The delay adjustment circuit 114 is coupled to the radio frequency modulation circuit 116, which, in turn, is coupled to the power amplifier 134. Coupled between the envelope tracking signal generation circuit 104 on the transceiver IC 102 and the noise filter 124 on the ETPS IC 122, is the DAC 106 and the anti-aliasing filter 108. The DAC 106 and second filter 108 are coupled together so that the second filter 108 is located between the DAC 106 and the first filter 124. In separate embodiments, the DAC 106 and coupled noise filter 124 are both located on the same IC, either the first IC 122 or second IC 102. In an alternate embodiment, the DAC 106 is located on the second IC 102 (and in one arrangement incorporated into circuit 104) while the second filter 108 is located on the first IC 122. Where the DAC 106 is located on the first IC 122, the connection 118 is a digital connection, otherwise, it is an analog connection to support the analog output of the DAC 106.

The filter control circuit 110 is communicatively coupled to the delay adjustment circuit 114, the envelope tracking circuit 104, the hardware interface 112, and the anti-aliasing filter 108 if it is located on the second IC 102. The filter control circuit is also capable of exchanging signals or messaging with the first filter 124 and the filter reference circuit 130 on the first IC 122 via an indirect connection (i.e., a coupling) established over the digital interface 120. The digital interface 120 links the hardware interface 112 on the second IC 102 to the corresponding hardware interface 128 on the first IC 122. The hardware interface 128, in turn, is coupled directly to the noise filter 124, the filter reference circuit 130, and also the anti-aliasing filter 108 in embodiments where the anti-aliasing filter 108 is located on the first IC 122. Finally, the envelope tracking power supply circuit 126 is coupled between the noise filter 124 and the power amplifier 134.

We turn now to a brief description of certain characteristics of and signals generated by system elements within system 100. In an embodiment, the transceiver IC 102: modulates a carrier signal with a delay adjusted baseband signal 144 to generate a radio frequency signal 146 that is amplified by the power amplifier 134 to produce a radio frequency output signal 150; generates a representation of an envelope tracking signal 138; and controls the adjustment of filter corner frequencies and the relative timing between the radio frequency signal 146 and a power supply signal 148 to the power amplifier 134. The ETPS IC 122, which is coupled to the second IC 102 by the connection 118 and the digital interface 120, generates reference values, filters an envelope tracking signal 140 to generate a filtered envelope tracking signal 142, and generates the power supply signal 148 from the filtered envelope tracking signal 142.

In general, elements within system 100 may be configured or adapted by implementing purposed components, with memory and/or processing capability, and interfaces that operatively couple elements to one another to provide the means for these system elements to implement their desired functionality as described, for example, by reference to FIGS. 2-5. In one embodiment, for instance, the filter control circuit 110, the delay adjustment circuit 114, and the envelope tracking signal generation circuit 104 all comprise logic gates implemented with diodes and/or transistors as a means to achieve processing capability. As another example, the noise filter 124 and the filter reference circuit 130 implement particular components, such as adjustable or variable resistors or capacitors, that enable them to perform their intended functionality.

Both the first 124 and second 108 filters are characterized by respective passbands used to pass at least one desired frequency component of an input signal (to the filter) that is within the passband, respective stopbands used to attenuate at least one undesired frequency component of the input signal (to the filter) that is within the stopband, and at least one corner frequency (i.e., cutoff frequency) between the passband and stopband. The corner frequency of a filter is defined as the frequency at which the voltage of the output signal is attenuated by approximately 3 decibels (db) or about 29.3% relative to the input signal to the filter.

A corner frequency can be measured directly, or determined, for example, from one or more pole values associated with a filter. Pole values are defined as the complex roots of the denominator of a filter's transfer function where the transfer function is a ratio of the Laplace transforms of the filter's output and input signals as a function of a complex frequency variable. The poles and zeros (i.e., roots of the numerator of the transfer function) of the transfer function mathematically define the response characteristics of a filter. This includes both amplitude and phase responses.

The first filter 124 comprises a first plurality of coupled circuit components, and the filter reference circuit 130 comprises a second plurality of coupled circuit components, wherein the first and second plurality of coupled circuit components are of a same process type. Circuit components of the same process type, as used herein, refers to like circuit components being manufactured together as part of the same batch IC fabrication process. In this way, like circuit components have the same variations in their attributes that result from the fabrication process. Circuit components are coupled in that they are interconnected and operate together to perform their intended operation, in this case operating as a filter, which can be either in an active or passive mode depending upon the circuit components that make up the filter.

The first filter 124, and in some embodiments also the second filter 108, is adjustable in that one or more of its passbands can be tuned or changed. To accomplish this, the first filter 124 comprises some adjustable components, such as adjustable resistors, capacitors, and/or inductors, for example, which can have their values altered during normal operation. The first filter 124 also comprises the means to adjust these components. In one embodiment, for example, the first filter 124 is a switched-capacitor filter that utilizes a bank of metal-oxide semiconductor (MOS) capacitors that are controlled by independently activated switches. In an alternative embodiment, a variable resistance, implemented by adjusting the bias on a MOS channel is used.

Tuning the first filter begins with reference values supplied by the filter reference circuit 130. To avoid difficulties associated with measuring the corner frequency of the noise filter 124 during operation, the filter reference circuit 130 comprises a reference filter that serves as a "surrogate" for the noise filter 124. This means that the reference filter within the reference circuit 130 comprises similar or identical components that are of the same process type as components used in the first filter 124. In this way, a measurement of a corner frequency (or pole) of the reference filter provides a more accurate representation of an actual corner frequency (or pole) of the noise filter 124. The filter reference circuit 130 additionally comprises components used for determining and communicating measurements of the reference filter, as indicated below with reference to FIGS. 2 and 3. In alternate embodiments, a separate reference filter representing the second filter 108 is included within the filter reference circuit 130, or on a second filter reference circuit (not shown) on the first or second IC, depending on where the second filter 108 resides. In a further embodiment, there is no reference filter and corner frequency (or pole) measurements are made at the first filter 124.

Measured reference values and resulting filter adjustment values determined by the adjustable filter system 100 are passed between the first 122 and second 102 ICs via the digital interface 120, which may conform to a Mobile Industry Processor Interface (MIPI®) Alliance standard, or be based on a custom standard.

Figure 2:
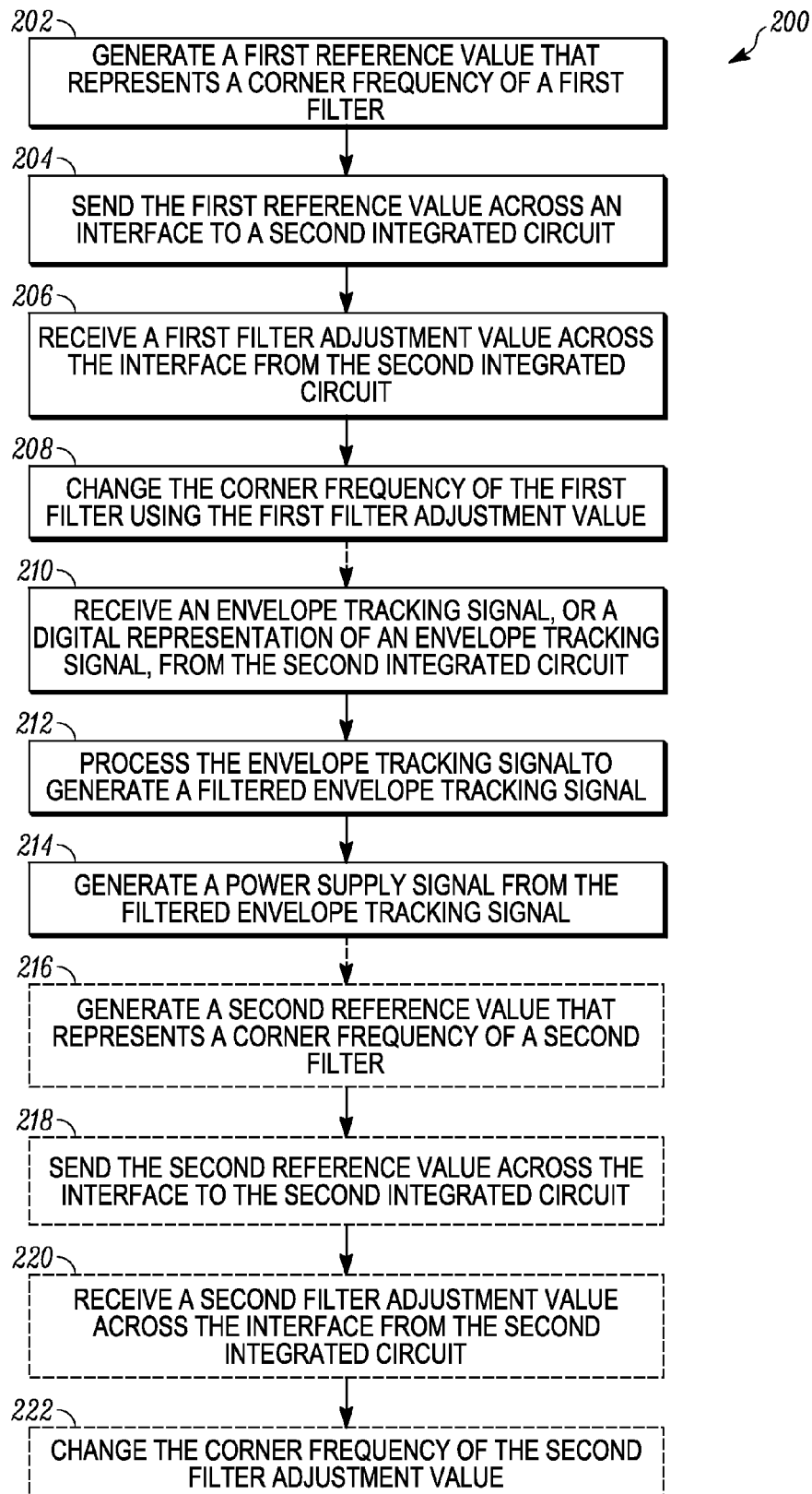
FIG. 2 is a logical flowchart illustrating a method for adjusting a corner frequency of a filter circuit in accordance with an embodiment of the present teachings.
Figure 3:
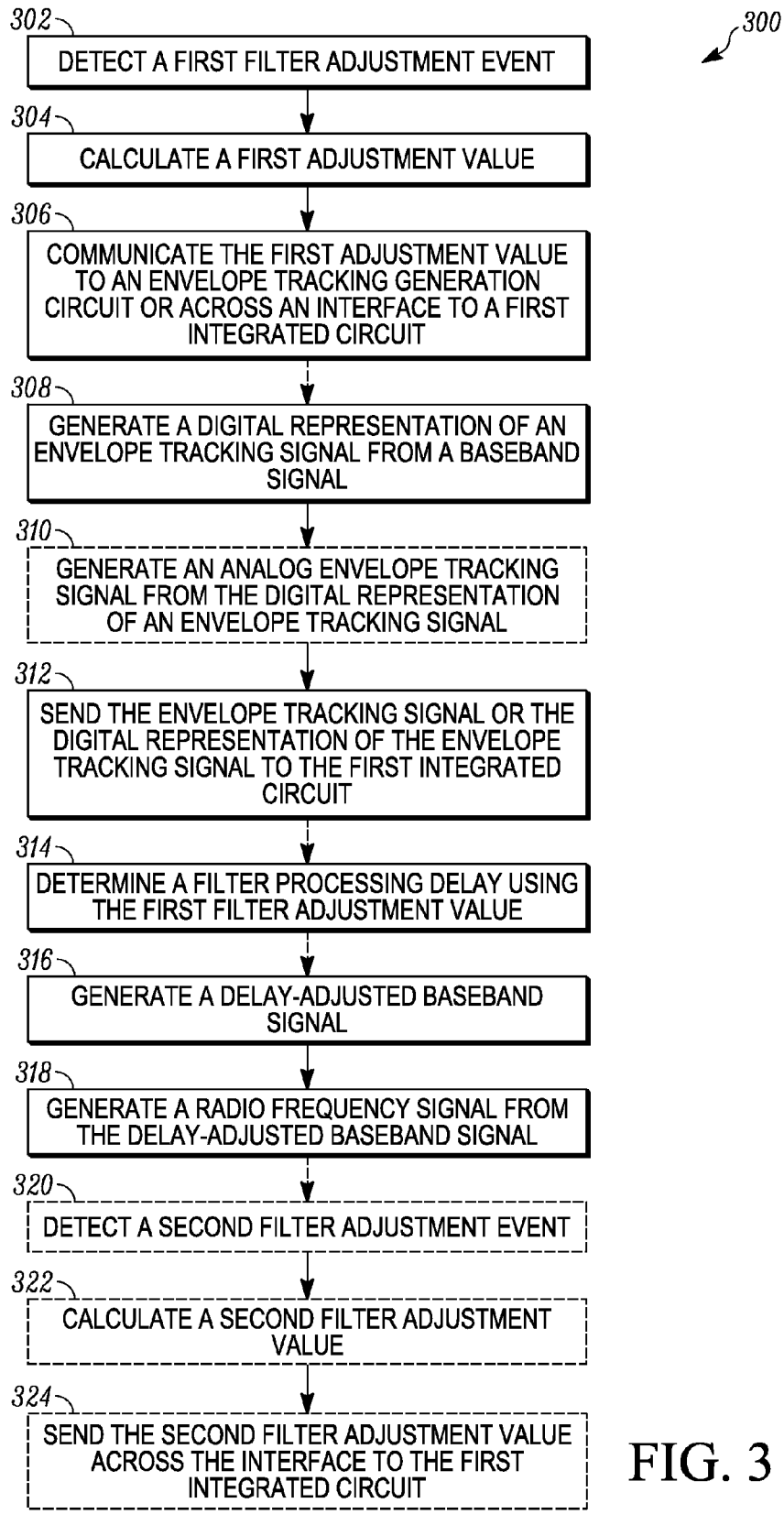
FIG. 3 is a logical flowchart illustrating a method for adjusting a corner frequency of a filter circuit in accordance with an embodiment of the present teachings.

We turn now to a detailed description of the functionality of the system 100 elements in accordance with the teachings herein and by reference to the remaining figures. FIGS. 2 and 3 show logical flow diagrams at 200 and 300, respectively, illustrating a method for adjusting the corner frequencies of the first 124 and second 108 filters within the ABETPS 100 and for synchronizing the arrival times of the power supply signal 148 and the radio frequency signal 146 at the power amplifier 134. FIG. 2 shows the functionality performed by the components of the first IC 122, whereas FIG. 3 shows the functionality performed by the components of the second IC 102. Because the actions performed by, and the signals passed between, the two ICs are interdependent, FIGS. 2 and 3 are described together rather than separately so that their description provides an accurate representation of the order in which the actions and signals occur for the two ICs.

In an embodiment, the first IC 122 generates a reference value to begin the process of making a corrective adjustment (if needed) to the passband of the noise filter 124. The reference value is generated at a time determined by a controller (not shown). Such a controller may reside on either the first 122 or second 102 IC, for instance. Alternatively, a filter tracking algorithm implemented by the filter control circuit 110 on the second IC 102 can set one or more conditions or times for which a reference value is generated. For example, a reference value may be generated once at startup to calibrate the system 100, or a reference value may be generated periodically to compensate for conditions, such as temperature, that affect the passband of the noise filter 124 over time.

More particularly, with respect to method 200 of FIG. 2, at 202, the filter reference circuit 130 on the first IC 122 generates or measures a reference value that represents the corner frequency of the first filter 124. In a possible embodiment, the filter reference circuit 130 comprises a representative (or reference) filter that is identical or similar in design to the first filter 124, as indicated above, and the reference value is a measured parameter or variable that represents the corner frequency of the representative filter, including but not limited to, a pole or zero of the representative filter, a value of an adjustable component within the representative filter, a time constant, or a measured corner frequency of the representative filter.

Because the first filter 124 comprises circuit components of the same process type as the representative filter, the corner frequencies of the first filter 124 and the representative filter track together with process or temperature variations. Therefore, the reference value also indicates or represents the corner frequency of the noise filter 124. For example, if the measured reference value of the representative filter indicates that the corner frequency of the representative filter is high by five percent (for instance as a result of a temperature elevation), it is expected that the corner frequency of the first filter 124 is also high by five percent over its nominal design value. The nominal design value is defined as the intended corner frequency value for which the filter was designed. In an embodiment, the nominal design value is a desired optimal value that provides the bandwidth needed to filter or attenuate undesired frequencies (also referred to herein as frequency components) from the input signals received into the noise filter 124.

A variety of techniques can be used to generate or measure the reference value. In one embodiment, a square wave of voltage is applied to the representative filter to determine its time constant, z, from a measured rise or decay time occurring during a certain number of clock cycles of a clock signal. Using the time constant as the reference value, the corner frequency of the representative filter is calculated with an appropriate formula, which depends at least in part on the constituent components of the representative filter. For a first-order low-pass RC filter, for example, the dependency of the corner frequency, $f_c$, on the time constant is:

$$f_c = \frac{1}{2\pi\tau}.$$

In an alternate embodiment, the reference value comprises a corner frequency that is generated by taking iterative measurements of input and output voltages as the representative filter is repeatedly driven with sine waves of different frequencies and determining the frequency for which the gain falls by about 3 db, or where the voltage of the output signal from the representative filter is attenuated to about 70.7% as compared to the voltage of the input signal into the representative filter. To arrive at the reference value in yet another embodiment, the gain of the output signal from the representative filter for different frequencies is compared against the gain of a very low output frequency that is well within the expected passband of the representative filter. Here again, the reference value comprises a corner frequency. Other means of generating reference values are also possible. For example, in a further embodiment, the reference value comprises a pole or zero value of the reference circuit, a value (e.g., resistance, capacitance and/or inductance) of a constituent component of the representative filter, or some other value from which a corner frequency can be determined.

At 204, the first IC 122 sends the reference value that represents the corner frequency of the first filter 124 across the digital interface 120 to the second IC 102 for use in generating the first filter adjustment value. The filter reference circuit 130 provides the generated reference value to the filter control circuit 110 on the second IC 102 via the hardware interface 128 on the first IC 122, the digital interface 120 between the two ICs, and the corresponding hardware interface 112 on the second IC 102. The filter control circuit 110 detects (at 302 in FIG. 3) the arrival of the reference value and interprets it as a filter adjustment event.

A filter adjustment event is defined herein as an event (e.g., a signal, message, etc.) that serves as a trigger to the filter control circuit 110 to review and adjust (if necessary) the passband of a filter within the ABETPS 100 (e.g., the noise filter 124 and/or the anti-aliasing filter 108) or to adjust the representation of the envelope tracking signal 138 to compensate for a change in the corner frequency of a filter within the ABETPS 100. In the above example, the filter adjustment event comprises receipt, across the digital interface 120 from the first IC 122, of a reference value that indicates the corner frequency of the first filter 124, which is used to calculate the first filter adjustment value. Because the corner frequency of a filter represents a point of demarcation between a passband and a stopband of the filter, making an adjustment to the corner frequency of a filter is used interchangeably with making an adjustment to the passband of the filter.

In response to detecting a filter adjustment event, in this case receiving the reference value sent by the filter control circuit 110, the second IC 102 calculates (at 304 in FIG. 3), using a processing device within the filter control circuit 110 or elsewhere on the second IC 102, a first adjustment value and communicates (at 306 in FIG. 3) the first adjustment value to another component within the system 100. For example, in an embodiment, the first adjustment value comprises a first filter adjustment value used to compensate for a change in corner frequency of the first filter 124, and the filter control circuit 110 communicates the first filter adjustment value across the interface 120 to the first filter 124. In a further embodiment, the first filter adjustment value comprises a first-type adjustment value for moving the at least one corner frequency of the first filter 124 in response to at least one condition of the first IC 122. Conditions of the first IC 122 include, but are not limited to, temperature and process variations that shift the corner frequency of the first filter 124 away from its nominal design value, as indicated above. A deviation in the supply voltage of the first IC 122 away from its nominal design value and the aging of components within the first filter 124 are further examples of conditions on the first IC 122 that can affect the corner frequency of the first filter 124.

The first filter adjustment value is defined to be a figure or set of instructions that, when received by the first IC 122, is sufficient to allow for the corner frequency of the first filter 124 to be adjusted as indicated. In a particular embodiment, for example, where the dependence of the corner frequency on the resistance, R, and capacitance, C, of a first-order low-pass RC filter is:

$$f_c = \frac{1}{2\pi RC},$$

the first filter adjustment value comprises at least one (i.e., one or both) of a resistor adjustment value or a capacitor adjustment value. The resistor and/or capacitor adjustment value serves as an instruction to change the value of a variable resistor and/or capacitor of the first filter 124 by a specified amount as indicated by the adjustment value. In another embodiment, the filter adjustment value comprises a new corner frequency or pole value for the first filter 124, and the first filter 124 is configured with logic to determine the values of its adjustable components to affect a change to its passband.

Turning momentarily back to 302, in a different embodiment, one that uses Wideband Code Division Multiple Access (WCDMA) or Long Term Evolution (LTE) standards for example, the filter adjustment event comprises a change in at least one of: a system bandwidth, or an allocated bandwidth. In this embodiment, the first filter adjustment value comprises a second-type adjustment value for moving the at least one corner frequency of the first filter 124 in response to a change in the system bandwidth, the allocated bandwidth, or both. In this case, the filter adjustment event is no longer a reference value received from the filter reference circuit 130, but rather an indication that a new bandwidth is required of the ABETPS 100. In a particular embodiment, the ABETPS 100 is used within a Long Term Evolution (LTE) communication system, with a base station, for example, that allows for bandwidths to be changed.

In one embodiment, the new bandwidth is a system (i.e., channel) bandwidth. The system bandwidth is defined by the maximum number of 180 kHz resource blocks that can be allocated for a channel. For example, system bandwidths of 5 MHz and 10 MHz have a maximum resource block allocation of 25 blocks and 50 blocks, respectively. A change in system bandwidth results in a filter adjustment event being sent to the filter control circuit 110, which, in turn, generates a filter adjustment value to adjust the passband of the first filter 124 for the new system bandwidth.

In another embodiment, the filter control circuit 110 receives a filter adjustment event in response to a change in allocated (i.e., transmission) bandwidth. The allocated bandwidth is defined by how many of a maximum number of allowable resource blocks are allocated for use at a given time. For a given system bandwidth, the allocated bandwidth changes dynamically, sometimes as often as once every millisecond. Here too, a filter adjustment value is sent to the first IC 122 indicating that at least one corner frequency of the first filter 124 needs to be adjusted to affect a change in its passband.

When the first filter adjustment value is generated as a result of a change in the system or allocated bandwidth, the value comprises a second-type adjustment value because it is no longer generated in response to a filter adjustment event originating from the filter control circuit 130. First-type adjustments are corrections that compensate for (undesired) conditions that exist at the first filter 124, whereas second-type adjustments are associated with a change of system parameters (i.e., bandwidth changes).

The magnitude of first-type adjustments generally range between zero and ten percent for temperature variations and between zero and thirty percent for process variations. Channel bandwidth typically changes between values of 5, 10, and 20 MHz, with the largest increment being 18.6 MHz (from 1.4 to 20 MHz), while the allocated bandwidth can change by as little as one percent (one resource block de-allocated from 100 for a 20 MHz channel). As another point of distinction, adjustments for process variations and changes in system bandwidth tend to be larger and less frequent as compared to adjustments for temperature variation and changes in allocated bandwidth, which tend to be relatively smaller and more frequent.

After calculating the appropriate first filter adjustment value in response to a filter adjustment event, the filter control circuit 110 sends (at 306 in FIG. 3) the value across the interface 120 to the first IC 102, where it is received (at 206 in FIG. 2) and used to change (at 208 in FIG. 2) the corner frequency of the first filter 124 as specified or indicated by the first filter adjustment value. In a specific embodiment, the first filter 124 is a tunable filter designed to be tuned or adjusted using a digital signal (e.g., representing a voltage) that it receives from the filter control circuit 110 across the digital interface 120. In a further embodiment, matching adjustable components within the reference filter of the filter reference circuit 130 are also adjusted with the adjustable components within the first filter 124. In this way, the reference filter remains an accurate representation of the first filter 124 for future measurements of the corner frequency.

In an alternate embodiment, the first adjustment value is communicated (at 306 in FIG. 3) to the envelope tracking signal generation circuit 104 on the second IC 102 for modifying a representation of an envelope tracking signal 138 to compensate for the change in corner frequency of the first filter 124. Because the envelope tracking signal generation circuit 104 leads the noise filter 124 on the ET path, as indicated below, the output of the envelope tracking signal generation circuit 104 is digitally pre-distorted in a way that corrects for the effect of a misadjusted corner frequency and effectively restores the optimum bandwidth. No filter adjustment value needs to be generated or sent to the noise filter 124 in this embodiment because the passband of the noise filter 124 is not being adjusted.

Instead, the filter control circuit 110 generates (at 304 in FIG. 3) a signal generation adjustment value (as the appropriate adjustment value) after receiving a filter adjustment event from the filter reference circuit 130. The filter control circuit 110 then sends (at 306 in FIG. 3) the signal generation adjustment value to the envelope tracking signal generation circuit 104. There, the envelope tracking signal generation circuit 104 uses the signal generation adjustment value to determine exactly how the representation of the envelope tracking signal 138 is to be digitally modified so the filtered envelope tracking signal 142 output by the first filter 124 mimics the signal that would be output by the first filter 124 if its passband were properly adjusted. Usually, digital modification of the representation of the envelope tracking signal 138 is implemented when a small adjustment (i.e., within a few percent) to the passband of the noise filter 124 is needed as opposed to a larger adjustment. An adjustment made to the passband of the first filter 124 in response to a change in system bandwidth, for example, is generally too great to be effectively implemented by digitally distorting the representation of the envelope tracking signal 138.

In a particular embodiment where digitally distorting the representation of the envelope tracking signal 138 is used as a means to compensate for a deviation of the corner frequency of the noise filter 124 away from its nominal design value, the filter control circuit 110 also sends an adjustment value to the delay adjustment circuit 114 to bring the system 100 back into time alignment as described below with reference to FIGS. 4 and 5. For example, if the filter reference circuit 130 indicates in a reference value sent to the filter control circuit 110 that the passband of the first filter 124 is narrower than its nominal design value, then the filter control circuit 110 is aware that the first filter 124 is introducing a time delay into the filtered envelope tracking signal 142 that is larger than an optimal value for which the system 100 was designed. The filter control circuit 110 is also aware of how digitally distorting the representation of the envelope tracking signal 138 might further affect the timing of the filtered envelope tracking signal 142. The adjustment value that the filter control circuit 110 sends to the delay adjustment circuit 114 is designed to allow the delay adjustment circuit 114 to compensate for the narrow passband and added distortion by restoring the correct timing to the system 100, which comprises aligning a power supply signal 148 and a radio frequency signal 146 at the power amplifier 134.

The creation of the power supply signal 148 begins with a baseband signal 136 output from the baseband signal generation circuit 132. The baseband signal 136 is an analog or digital source signal that contains information on instantaneous amplitude and phase changes prior to being intermixed (i.e., modulated) onto a radio frequency carrier wave. The output of a microphone, for example, represents a baseband signal. The envelope tracking signal generation circuit 104 receives and processes the baseband signal 136 to generate (at 308 of FIG. 3) a representation of the envelope tracking signal 138 that becomes the envelope tracking signal 140 filtered by the noise filter 142.

In a possible embodiment depicted by FIG. 1, the envelope tracking signal generation circuit 104 digitally processes the baseband signal 136. Therefore, the representation of the envelope tracking signal 138 is a digital representation of the analog envelope tracking signal which is passed to the DAC shown at 106. The analog output of the DAC 106 is input to a low-pass anti-aliasing filter 108 (i.e., a reconstruction filter) to band-limit the signal and remove spurious high-frequency artifacts from it. It is the analog output from the anti-aliasing filter 108 that is the envelope tracking signal 140 filtered by the noise filter 124. In a first embodiment, both the DAC 106 and anti-aliasing filter 108 are located on the second IC 102, which generates (at 310 of FIG. 3) the analog envelope tracking signal 140 and sends it over the analog connection 118. In a second embodiment, the DAC 106 and anti-aliasing filter 108 are located on the second 102 and first 122 ICs, respectively, and the analog output of the DAC 106 is sent across the analog connection 118. In a third embodiment, both the DAC 106 and anti-aliasing filter 108 are located on the first IC 122, and the digital representation of the envelope tracking signal 138 is sent over the digital connection 118.

In an alternate embodiment, the representation of the envelope tracking signal 138 output by the envelope tracking signal generation circuit 104 is an analog signal. It might be that the envelope tracking signal generation circuit 104 is processing an analog baseband signal 136, or that digital-to-analog conversion takes place within the envelope tracking signal generation circuit 104. In either case, a separate DAC 106 and anti-aliasing filter 108, as shown in FIG. 1, are absent from the system 100. This analog representation of the envelope tracking signal 138 output by the envelope tracking signal generation circuit 104 is, accordingly, the envelope tracking signal 140 filtered by the noise filter 124.

The second IC 102 sends (at 312 of FIG. 3) and the first IC 122 receives (at 210 in FIG. 2) the analog envelope tracking signal 140 or the digital representation of the envelope tracking signal 138 (depending on the IC 102 component arrangement) to the first IC 122. At the first IC 122, the noise filter 124 receives the envelope tracking signal 140 from the DAC 106 and anti-aliasing filter 108 (which may be located on either IC as indicated above) and processes (at 212 of FIG. 2) the envelope tracking signal to generate the filtered envelope tracking signal 142. The envelope tracking signal 140 is processed by attenuating frequencies in the signal 140 that fall within the noise filter's 124 stopband relative to those that fall within its passband. In this way, the noise filter 124 generates a filtered envelope tracking signal 142 that represents a low-current reference voltage ($V_{ref}$) with a waveform that matches the radio frequency signal 146 to be amplified. Because $V_{ref}$ is too weak to power the power amplifier 134, the envelope tracking power supply circuit 126 converts (at 214 in FIG. 2) $V_{ref}$ into a high-current output voltage ($V_{out}$) that represents the power supply signal 148 that drives the power amplifier 134 as the amplifier 134 amplifies the radio frequency signal 146.

To create the radio frequency signal 146 received by the power amplifier 134, the delay adjustment circuit 114 receives the baseband signal 136 and generates (at 316 in FIG. 3) the delay-adjusted baseband signal 144. As indicated below, in a particular embodiment, the delay adjustment circuit 114 determines the amount of delay to add to the delay-adjusted baseband signal 144 from a filter adjustment value received from the filter control circuit 110. The delay-adjusted baseband signal 144 passes to the radio frequency modulation circuit 116 where it is used to modulate a carrier signal and generate (at 318 of FIG. 3) the radio frequency signal 146 sent to the power amplifier 134. Because the delay-adjustment circuit 114 makes use of electronics to introduce a delay in the delay-adjusted baseband signal 144, the radio frequency signal 146 that is created from it is retarded relative to the radio frequency signal that would have been created had no delay been introduced. Introducing the proper delay into the RF signal path allows for time alignment between the radio frequency signal 146 and the power supply signal 148 at the power amplifier 134. Aligning the waveform of the power supply signal 148 with the corresponding modulation of the radio frequency signal 146 preserves the modulation and spectral fidelity in the radio frequency output signal 150 generated by the power amplifier 134.

While the power supply signal 148 and the radio frequency signal 146 are produced from the same baseband signal 136, their relative alignment changes as the passband of the noise filter 124 and/or anti-aliasing filter 108 in the envelope-tracking signal path vary. This is because the filters are characterized by certain reactive components, such as capacitors and/or inductors, that are capable of introducing frequency-dependent phase shifts into the filtered envelope tracking signal 142. Where the overall phase is linear, the group delay (i.e., the first derivative of the phase angle with respect to frequency, also referred to herein as filter processing delay) is constant, resulting in a time-shifted waveform that retains its original shape. In other embodiments, a non-linear phase results in a filtered waveform that is both time-shifted and distorted in shape from its pre-filtered representation. By introducing the correct frequency-dependent delay to the RF signal path at the delay adjustment circuit 114, the combined group delay of the filters 108, 124 in the envelope-tracking signal path is compensated for, allowing the waveform of the power supply signal 148 to be matched up at the power amplifier 134 in shape and time with the modulation of the radio frequency signal 146.

In a particular embodiment, the delay adjustment circuit 114 on the second IC 102 also receives the first filter adjustment value from the filter control circuit 110 and determines (at 314 in FIG. 3) from it a delay (which corresponds to and compensates for a filter processing delay) to add to the delay-adjusted baseband signal 144 to synchronize the timing of arrival of the power supply signal 148 and the radio frequency signal 146 at the power amplifier 134. The correct delay is determined using the processing capability present on the first IC 102, which has knowledge of both the design of the noise filter 124 and how its corner frequency will be changed by the first filter adjustment value.

Figure 4:
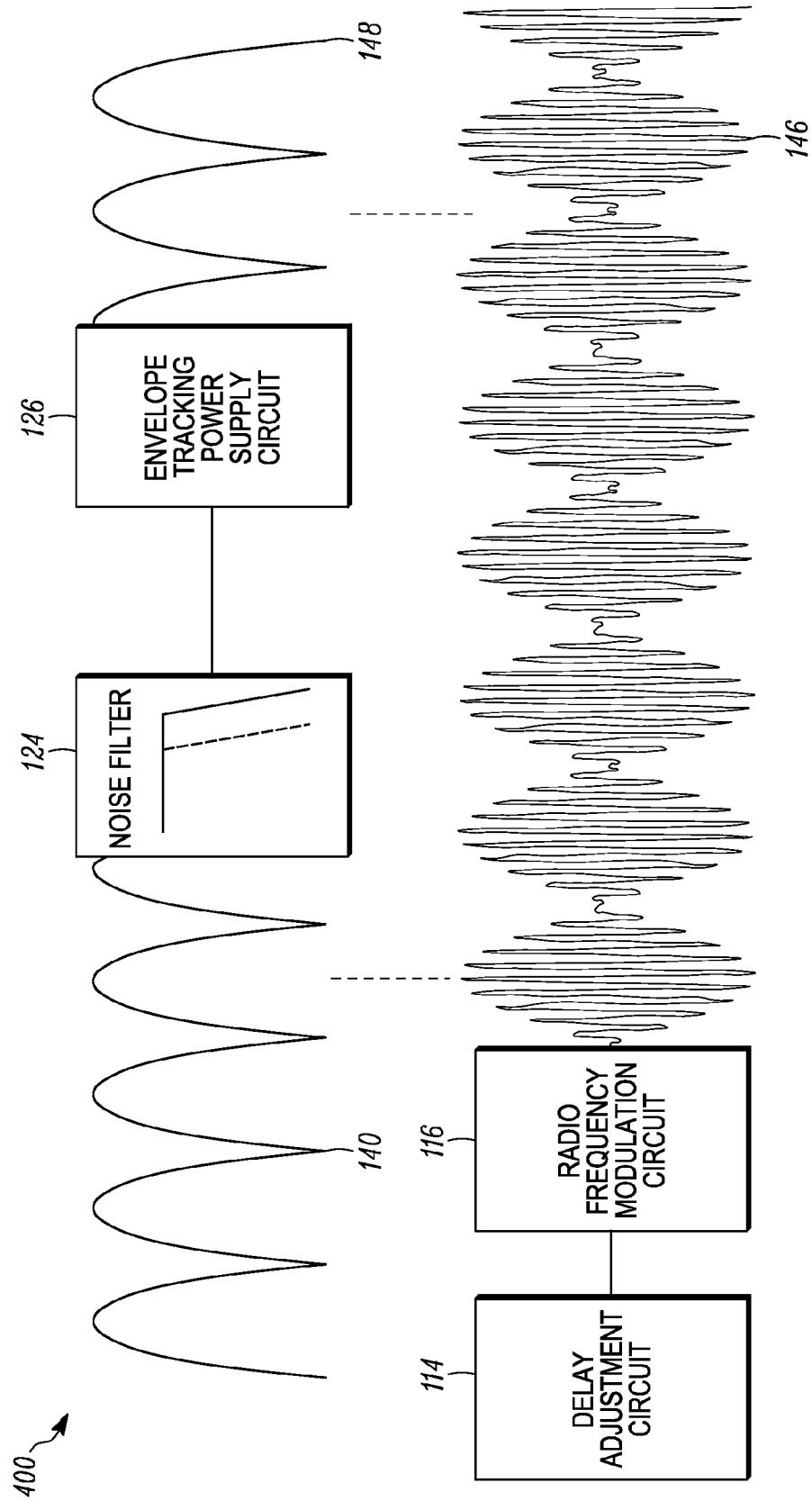
FIG. 4 is a schematic diagram illustrating the adjusting of the relative timing between a radio frequency signal and a power supply signal in accordance with an embodiment of the present teachings.
Figure 5:
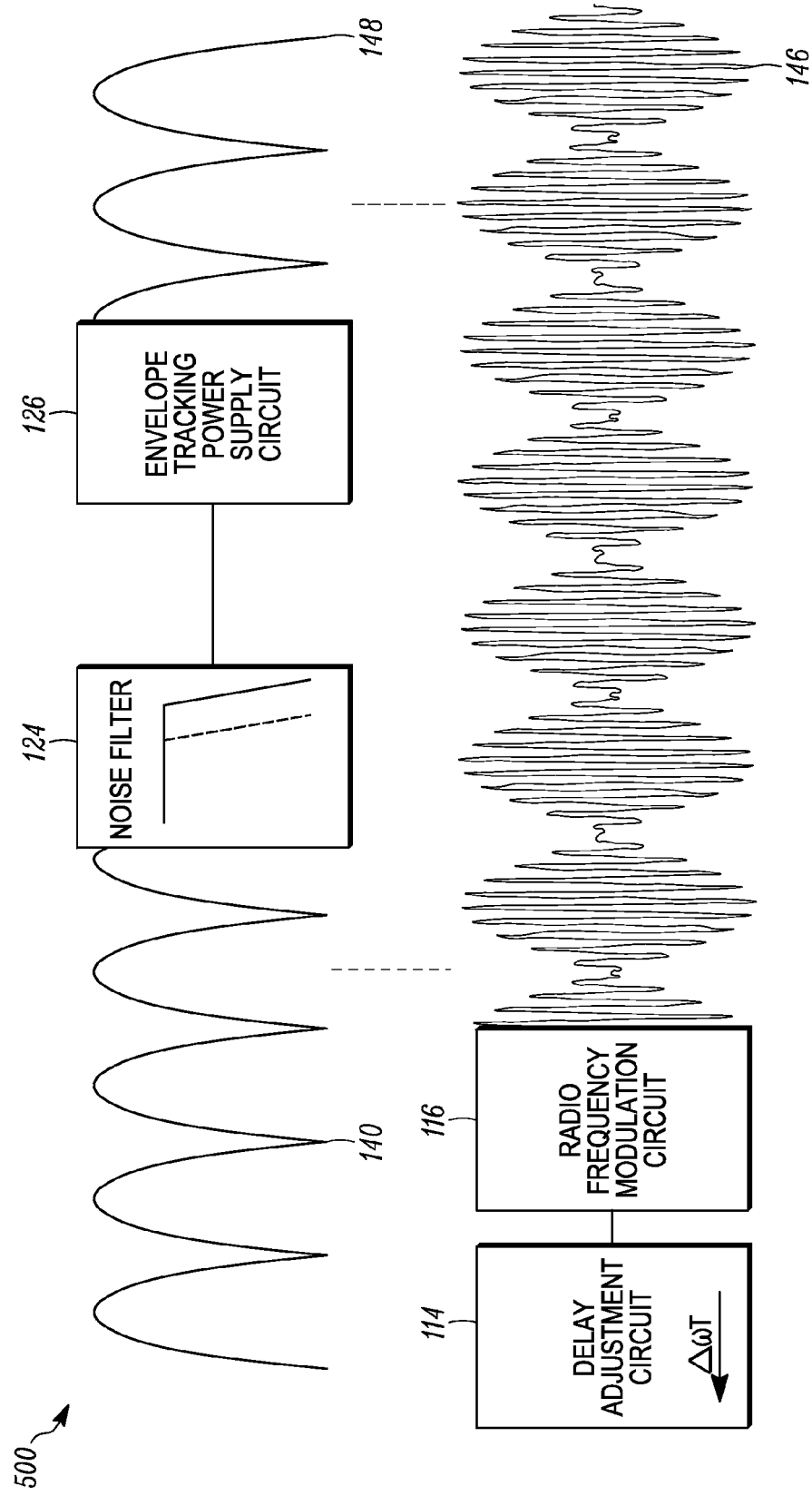
FIG. 5 is a schematic diagram illustrating the adjusting of the relative timing between a radio frequency signal and a power supply signal in accordance with an embodiment of the present teachings.

Turning momentarily to FIGS. 4 and 5 to describe delay adjustments in more detail, schematic diagrams illustrating the time alignment between the power supply signal 148 and the radio frequency signal 146 are shown and indicated generally at 400 and 500. In particular, FIGS. 4 and 5 show the adjustable noise filter 124 coupled to the envelope tracking poser supply circuit 126. The noise filter 124 receives the envelope tracking signal 140 and generates from it a filtered envelope tracking signal 142 (not shown) which is converted by the envelope tracking power supply circuit 126 into the power supply signal 148 that powers the power amplifier 134. The noise filter 124 causes a temporal shift or change of phase angle in the filtered envelope tracking signal 142 relative to the envelope tracking signal 140 it receives. This change of phase carries through the signal conversion process occurring at the envelope tracking power supply circuit 126, resulting in the power supply signal 148 being phase shifted relative to the envelope tracking signal 140. The envelope tracking power supply circuit 126 may add an additional phase shift to the power supply signal 148, which is independently compensated for by a separate means other than the embodiments described in connection with the present disclosure, such as a fixed adjustment based on a calibration of the envelope tracking power supply circuit 126 made during the manufacturing process.

Shown below the noise filter 124 and the envelope tracking power supply circuit 126 in FIG. 4, is a radio frequency signal 146 output by the radio frequency modulation circuit 116 which is not being delay-adjusted by the delay adjustment circuit shown at 114. As indicated by the left-most broken vertical line, the transients (amplitude maximums) of the simplified representation of the radio frequency signal 146 line up with the voltage peaks (amplitude maximums) of the envelope tracking signal 140. After the envelope tracking signal 140 is filtered and converted, however, the transients of the radio frequency signal 146 are no longer in time alignment with the voltage peaks of the power supply signal 148, as indicated by the right-most broken vertical line.

In FIG. 5, the delay adjustment circuit 114 adds a delay to the radio frequency signal 146, thereby changing its phase relative to the radio frequency signal 146 shown in FIG. 4 to which no delay was added. The phase change of the delayed signal (indicated in FIG. 5 by "Acct") may be constant, or have a linear or nonlinear dependence on frequency. The broken vertical lines in FIG. 5 show the delay-adjusted radio frequency signal 146 is no longer in time alignment with the envelope tracking signal 140 prior to it being filtered and converted, but that the voltage maxima of the power supply signal 148 are now in time alignment with the transients of the modulated delay-adjusted radio frequency signal 146. This time alignment is preserved as both signals reach the power amplifier 134. For a particular embodiment, the delay adjustment circuit 114 makes a timing adjustment affecting the radio frequency signal 146 each time an adjustment is made to the corner frequency of the noise filter 124.

In another embodiment, the envelope tracking signal generation circuit 104 coupled to the filter control circuit 110 is further configured to receive from the filter control circuit 110 the first filter adjustment value and to make a timing adjustment, determined from the first filter adjustment value, to the representation of the envelope tracking signal 138 to synchronize timing of arrival of the power supply signal 148 and the radio frequency signal 146 at the power amplifier 134. The envelope tracking signal generation circuit 104 comprises components that give it a limited ability to adjust the timing (i.e., frequency-dependent phase) of the representation of the envelope tracking signal 138. This change of phase (i.e., timing adjustment) carries through any filtering and affects the alignment of the power supply signal 148 relative to the radio frequency signal 146.

In a possible embodiment, the ABETPS 100 uses delay adjustment circuitry present in both the RF signal path and the envelope-tracking signal path to achieve synchronization of the two signals at the power amplifier 134. Coarse adjustments can be made to the timing of the radio frequency signal 146 by the delay adjustment circuit 114, for example, while fine adjusting for synchronization is accomplished at the envelope tracking signal generation circuit 104. In such an embodiment, adjusting timing (of the aforementioned signals) comprises at least one of: adjusting timing at a delay adjustment circuit 114 on the second integrated circuit 102 or adjusting timing at an envelope tracking signal generation circuit 104 on the second integrated circuit 102.

Returning now to FIG. 3, the above approach to adjusting the corner frequency of the noise filter can be used to adjust the corner frequency of other filters within the system 100, such as the anti-aliasing filter shown at 108 in FIG. 1 (also referred to as the second filter). The second filter 108 coupled between the DAC 106 and the first filter 124 is characterized by a second passband, a second stopband, and at least one corner frequency between the second passband and second stopband for filtering the envelope tracking signal 140. The filter control circuit 110 is further configured to generate a second filter adjustment value to move the at least one corner frequency of the second filter 108, and to send the second filter adjustment value to the second filter 108. Movement of a corner frequency, as used herein, is defined to be a shift of the corner frequency to a new frequency value.

In an embodiment, the first integrated circuit 122 includes the second filter 108, and the interface 120 is further configured to communicate the second filter adjustment value from the filter control circuit 110 to the second filter 108. The first IC 122, correspondingly: receives (at 220 in FIG. 2), across the interface 120 from the filter control circuit 110, the second filter adjustment value; and changes (at 222 in FIG. 2) a corner frequency of the second filter 108 on the first integrated circuit 122 using the second filter adjustment value to generate a modified passband and stopband for the second filter 108. An example method for compensating for movement of the corner frequency of the second filter 108 comprises the second IC 102 receiving (at 320 in FIG. 3), across the interface 120, a second reference value that indicates a change in corner frequency of the second filter 108 on the first integrated circuit 102; calculating (at 322 in FIG. 3), from the second reference value, a second adjustment value to compensate for the change in corner frequency of the second filter 108; and sending (at 324 in FIG. 3) the second adjustment value to the second filter 108 over the interface 120.

Several variations on the above method are possible. In one embodiment, wherein the first IC 122 includes the second filter 108, the filter reference circuit 130 generates (at 216 in FIG. 2) a reference value that comprises information relating to the corner frequencies of both the first filter 124 and the second filter 108 and sends (at 218 of FIG. 2) it across the interface 120 to the filter control circuit 110. Upon receiving the reference value, the filter control circuit 110 responds to the filter adjustment event by calculating (at 322 in FIG. 3)

two filter adjustment values: a first filter adjustment value, comprising information relating to the adjustment of the first filter 124, and also a second filter adjustment value, comprising information relating to the adjustment of the second filter 124. The filter control circuit 110 sends (at 324 of FIG. 3) the first and second filter adjustment values across the interface 120 to the first 124 and second 108 filter, respectively, so the indicated adjustments can be made (at 222 of FIG. 2).

In another embodiment, a single integrated filter operates as both a noise filter and an anti-aliasing filter. In a further embodiment, a single filter adjustment value is generated (at 322 in FIG. 3) by the filter control circuit 110 which comprises information on adjustments to be made to both filters 108, 124. In addition to the filter control circuit 110 sending the filter adjustment value across the interface 120 where it is received (at 220 in FIG. 2) by the first IC 122, the filter control circuit 110 also passes the value to the delay adjustment circuit 114, and possibly the envelope tracking signal generation circuit 104, so that the delay introduced into the RF signal and/or envelope-tracking signal paths by those circuits will compensate for the total filter processing delay resulting from the adjustments made to both filters 108, 124.

By implementing embodiments disclosed by these teachings, significant benefits may be realized over current state-of-the-art adjustable filter systems integrated within envelope tracking power supplies. Placing the noise filter 124 on the ETPS IC 122 allows for superior noise suppression while the interface 120 coupling the ETPS IC 122 to the transceiver IC 102 allows the ABETPS 100 to control the corner frequencies of the noise filter 124 to much closer tolerances than would otherwise be possible. As a result of the interface 120, the tracking system may also accurately calculate the phase of the noise filter 124 and compensate for it by introducing a corrective delay into one or more signal pathways.

The teachings described herein are also applicable to other types of systems having two ICs, wherein a first IC having a filter circuit is coupled by an interface to a second IC having a filter control circuit. One such system utilizes polar modulation to amplify a radio frequency signal. The amplitude information of a baseband signal is separated from the signal's phase information and incorporated into a supply-side signal path. The phase information is carried separately on an RF signal pathway. Here, as for embodiments of the ABETPS 100 discussed above, reference information from a filter reference circuit located with a low-pass filter on a first IC may be passed over an interface to a second IC that has control over adjusting the corner frequency of the low-pass filter to attenuate undesirable frequencies within the supply-side signal.

Another system comprises two ICs and a filter to drive a video display. An application processor IC runs graphical user interface software that generates a display data stream which passes to a display driver IC over an analog or digital interface. On the display driver IC, a low-pass filter filters the display data stream to suppress intersymbol interference before the data stream passes to an amplifier that provides sufficient power to drive the individual pixels of the display. Deviations in the bandwidth of the filter from its nominal design value result in visual artifacts, such as blurring or ringing, that diminish picture quality. The bandwidth of the filter may be corrected by placing a filter reference circuit on the display driver IC that passes filter reference values to a filter control circuit on the application processor IC, as described by the teachings herein, which may already control other aspects of the display properties. The display driver IC may also comprise a DAC and a reconstruction filter that can be adjusted from the filter control circuit on the application processor IC.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

The description refers to elements or features being "connected" or "coupled" together. As used here, unless expressly stated otherwise, "coupled" means that one element or feature is directly or indirectly joined to (or is in direct or indirect communication with) another element or feature, and not necessarily physically. As used herein, unless expressly stated otherwise, "connected" means that one element or feature is directly joined to (or is in direct communication with) another element or feature. Furthermore, although the various circuit schematics shown herein depict certain example arrangement of elements, additional intervening elements, devices, features, or components may be present in an actual embodiment (assuming that the functionality of the given circuit is not adversely affected).

For the sake of brevity, conventional techniques related to semiconductor fabrication techniques (including those using conventional CMOS technology) for fabricating ICs, baseband signal generation circuits, envelope tracking signal generation circuits, DACs, envelope tracking power supply circuits, power amplifiers and other functional aspects of the systems (and the individual operating components of the systems) may not be described in detail. Furthermore, the connecting lines shown in the various figures contained herein are intended to represent example physical and/or electrical couplings between the various elements. It should be noted that many alternative or additional physical or electrical connections may be present in a practical embodiment. Also, the ICs described above with respect to FIG. 1 may be produced or fabricated using conventional semiconductor processing techniques, in particular, well-known CMOS techniques. Further a variety of well-known and common semiconductor materials may be used, e.g., traditional metals (aluminum, copper, gold, etc.) for the connections between elements on and between the ICs and other elements of the system, silicon, polysilicon, silicon dioxide, silicon nitride, and the like.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An adjustable filter system comprising:
    a first integrated circuit comprising a first filter that is characterized by a first passband used to pass at least one desired frequency component of an input signal that is within the first passband, a first stopband used to attenuate at least one undesired frequency component of the input signal that is within the first stopband, and at least one corner frequency between the first passband and the first stopband, wherein first integrated circuit is an envelope tracking power supply circuit, and wherein the input signal is an envelope tracking signal generated from a baseband signal;
    a second integrated circuit comprising a filter control circuit configured to generate a first filter adjustment value to move the at least one corner frequency of the first filter, wherein the second integrated circuit is a transceiver integrated circuit, wherein the second integrated circuit further comprises:
        a delay adjustment circuit coupled to the filter control circuit and configured to calculate a delay of the first filter based on the first filter adjustment value to use in synchronizing timing of arrival, at a power amplifier, of a power supply signal generated from the envelope tracking signal and a radio frequency signal generated from the baseband signal; and
    an interface coupled between the first and second integrated circuits and configured to communicate the first filter adjustment value from the filter control circuit to the first filter.

2. The adjustable filter system of claim 1, wherein the first integrated circuit further comprises a filter reference circuit coupled to the interface and configured to provide a reference value used to generate the first filter adjustment value, wherein the reference value corresponds to a current position of the at least one corner frequency of the first filter, wherein the interface is further configured to communicate the reference value from the filter reference circuit to the filter control circuit.

3. The adjustable filter system of claim 2, wherein the first filter comprises a first plurality of coupled circuit components, and the filter reference circuit comprises a second plurality of coupled circuit components, wherein the first and second plurality of coupled circuit components are of a same process type.

4. The adjustable filter system of claim 1, wherein the interface comprises a digital interface.

5. The adjustable filter system of claim 1 further comprising:
    a second filter coupled to the first filter and characterized by a second passband, a second stopband, and at least one corner frequency between the second passband and the second stopband, wherein the filter control circuit is further configured to generate a second filter adjustment value to move the at least one corner frequency of the second filter.

6. The adjustable filter system of claim 5, wherein the first integrated circuit includes the second filter, and wherein the interface is further configured to communicate the second filter adjustment value from the filter control circuit to the second filter.

7. The adjustable filter system of claim 1, wherein the first filter adjustment value comprises a first-type adjustment value for moving the at least one corner frequency of the first filter in response to at least one condition of the first integrated circuit.

8. The adjustable filter system of claim 1, wherein the first filter adjustment value comprises a second-type adjustment value for moving the at least one corner frequency of the first filter circuit in response to a change in system bandwidth or allocated bandwidth.

* * * * *